(12) United States Patent
Tseng et al.

(10) Patent No.: US 8,098,100 B2
(45) Date of Patent: Jan. 17, 2012

(54) VARIABLE GAIN AMPLIFIERS

(75) Inventors: Po-Sen Tseng, Hsinchu Hsien (TW); Shin-Fu Chen, Tainan (TW)

(73) Assignee: Mediatek Inc., Hsin-Chu (TW)

( * ) Notice: Subject to any disclaimer, the term of this patent is extended or adjusted under 35 U.S.C. 154(b) by 169 days.

(21) Appl. No.: 11/686,515

(22) Filed: Mar. 15, 2007

(65) Prior Publication Data
US 2008/0224781 A1    Sep. 18, 2008

(51) Int. Cl.
*H03F 3/04*    (2006.01)
(52) U.S. Cl. ........................................ 330/289; 330/279
(58) Field of Classification Search .................. 330/289, 330/272, 256, 266, 278, 285, 279
See application file for complete search history.

(56) References Cited

U.S. PATENT DOCUMENTS

| 5,900,782 | A |  | 5/1999 | Igarashi et al. |
| 5,999,053 | A |  | 12/1999 | Eschauzier |
| 6,028,478 | A |  | 2/2000 | Seremeta et al. |
| 7,193,459 | B1 | * | 3/2007 | Epperson et al. ............. 330/130 |
| 7,193,470 | B2 | * | 3/2007 | Lee et al. ...................... 330/285 |
| 7,443,241 | B2 | * | 10/2008 | Fong et al. .................... 330/254 |

FOREIGN PATENT DOCUMENTS

| CN | 1073761 | 10/2001 |
| TW | 237576 | 1/1995 |

OTHER PUBLICATIONS

"A Single-Stage Variable-Gain Amplifier With 70-dB Dynamic Range for CDMA2000 Transmit Applications" Aggarwal et al., 2003, pp. 911-917.
CN Office Action mailed May 8, 2009.
English abstract of CN1073761.
English language translation of abstract of TW 237576 (published Jan. 1, 1995).

* cited by examiner

*Primary Examiner* — Michael Shingleton
(74) *Attorney, Agent, or Firm* — Thomas|Kayden

(57) ABSTRACT

Variable gain amplifiers with controllable gain gradient over temperature. A variable gain amplification circuit comprises an input terminal receiving an input signal, an output terminal outputting an output signal, and a control terminal receiving a first gain control signal. The relationship between gain of the variable gain amplification circuit and temperature is programmable rather than temperature independent, and is controlled by the first gain control signal obtained by a second gain control signal and a third gain control signal. The second gain control controls gain of a variable gain amplification circuit linearly, the third gain control signal controls gain gradient of the variable gain amplification circuit over temperature and the third gain control signal is determined based on a formula of $$S_{CT} = \sum_{n=1}^{N} S_n \left[ \left( \frac{T}{T_0} \right)^n - 1 \right],$$

in which $T_0$ represents a predetermined temperature, $T$ represents a present temperature, and $S_n$ represents the $n^{th}$ programmable signal.

14 Claims, 8 Drawing Sheets

VARIABLE GAIN AMPLIFIERS

BACKGROUND OF THE INVENTION

1. Field of the Invention

The invention relates to variable gain amplifiers, and in particular to variable gain amplifiers with controllable gain gradient over temperature.

2. Description of the Related Art

Many communication applications require variable gain exponentially proportional to an input voltage. Since, on a dB scale, a gain curve becomes a straight line, this is commonly referred to as "linear-in-dB". For example, linear-in-dB variable gain amplifiers are used in transceivers for cellular phones. A variable gain amplifier (VGA) serves as an output power controller in the automatic gain control loop of the transmitter to regulate the power of the signal transmitted from the cellular phone. A variable gain amplifier is also used in the receiver to vary the amount of gain according to the specific receiver operation and the strength of the received signal, to maintain a constant signal level.

Figure 1:
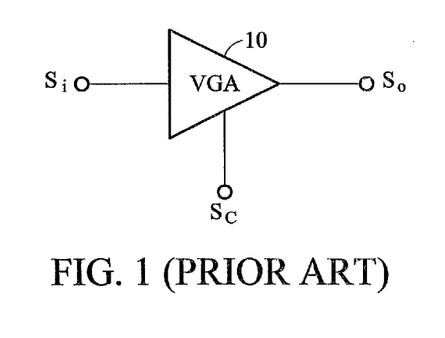
FIG. 1 shows a conventional variable gain amplifier.
Figure 2:
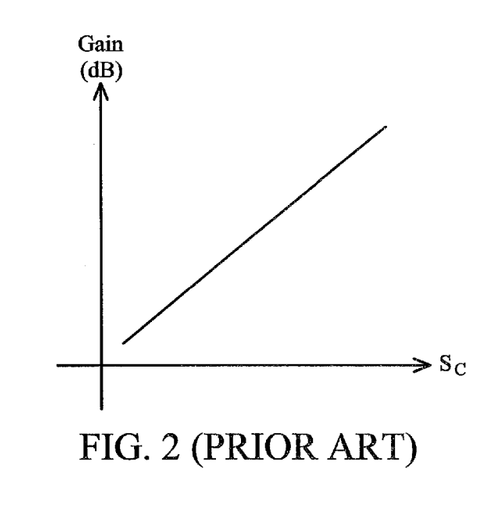
FIG. 2 shows the relationship between the control signal and gain of the variable gain amplifier of FIG. 1.

FIG. 1 shows a conventional variable gain amplifier. In transmitters and receivers in conventional communication application, the gain of VGAs is controlled by a control signal $S_C$ which is temperature independent to prevent temperature variation. FIG. 2 shows the relationship between the control signal $S_C$ and gain (in dB scale) of the variable gain amplifier, with gain gradient of the conventional variable gain amplifier is constant over temperature. The gain (G) can be represented by the following formula:

$$G = \frac{S_i}{S_o} = G_{max} + K_G(S_C - S_{offset}) \tag{1}$$

Wherein $S_o$ represents output signal, $S_i$ represents input signal, $S_C$ represents gain control signal, $K_G$ represents gain slope, $S_{offset}$ represents gain control signal at maximum gain and $G_{max}$ represents maximum gain.

BRIEF SUMMARY OF THE INVENTION

A detailed description is given in the following embodiments with reference to the accompanying drawings.

Embodiments of variable gain amplifiers are provided, in which a variable gain amplification circuit comprises an input terminal receiving an input signal, an output terminal outputting an output signal, and a control terminal receiving a first gain control signal, wherein the relationship between gain of the variable gain amplification circuit and temperature is programmable.

The invention also provides another embodiment of a variable gain amplifier, in which an input terminal receives an input signal, an output terminal outputs an output signal, and a programmable means controls the relationship between gain of the variable gain amplifier and temperature.

The invention also provides an embodiment of a transceiver, in which the disclosed variable gain amplifier amplifies the input signal and outputs the output signal based on the first gain control signal, and a power amplifier amplifies the output signal from the variable gain amplifier and transmits to a receiver via an antenna.

The invention also provides an embodiment of a gain control method for a variable gain amplifier, in which gain of a variable gain amplification circuit is linearly controlled based on a first gain control signal, and gain gradient of the variable gain amplification circuit over temperature is controlled based on a second gain control signal.

The invention also provides an embodiment of an electronic signal in a communication system controlling gain of a variable gain amplifier, in which the electronic signal is generated by a programmable means and added to a gain control signal which controls the gain of the variable gain amplifier linearly by an adding unit, such that the relationship between gain gradient of the variable gain amplifier and temperature is controllable.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
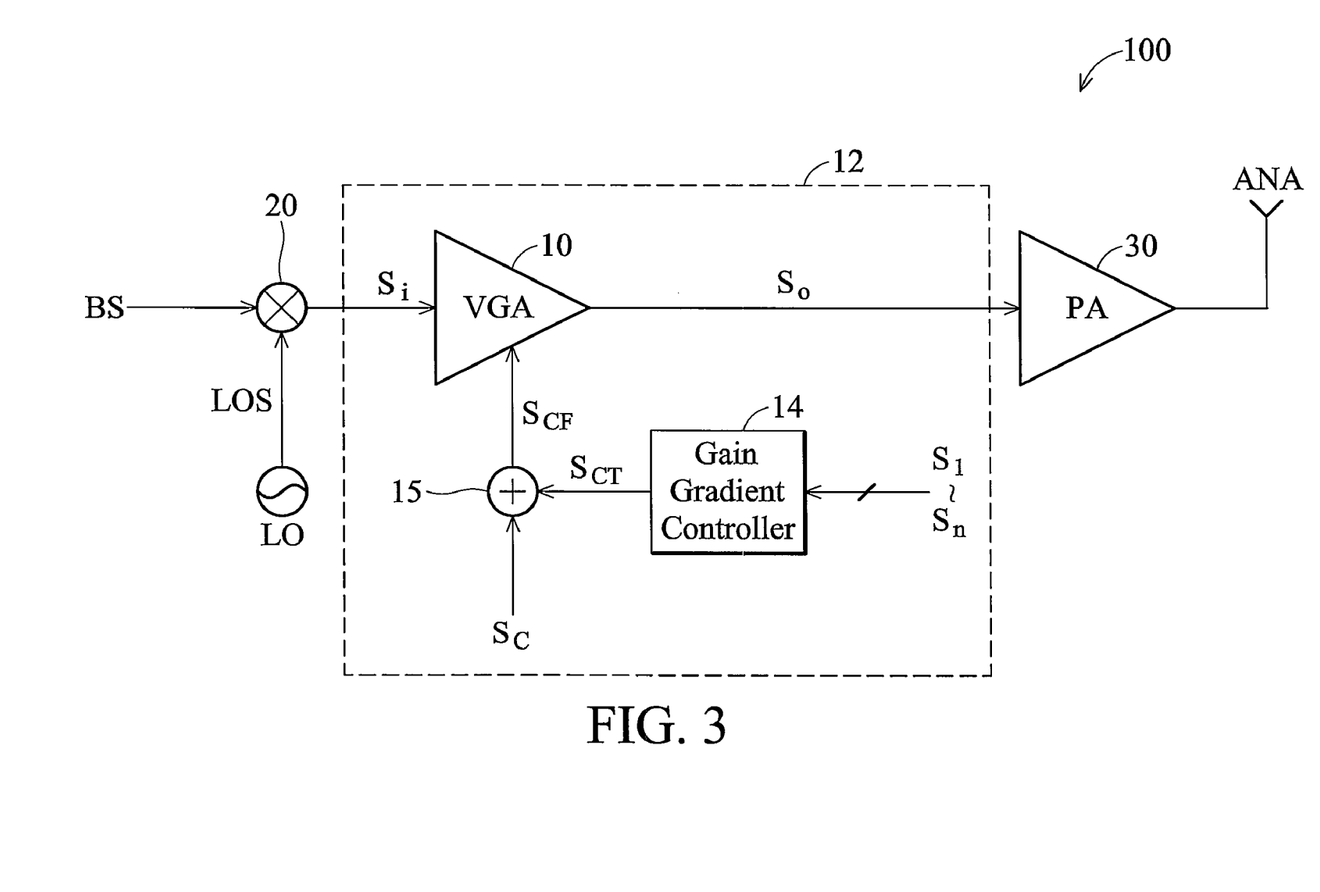
FIG. 3 shows an embodiment of a communication system.

FIG. 3 shows an embodiment of a communication system that includes a variable gain amplifier (VGA) in a transmitter. In order to compensate the temperature coefficient of transmitter's output power, the invention adds another gain control signal $S_{CT}$ to make the gain of the variable gain amplifier 12 a function of temperature rather than temperature independent, the coefficient of which can be defined by programmable signals $S_1$~$S_n$. In the embodiment of the invention, the programmable signals $S_n$, the control signals $S_C$ and $S_{CT}$ can be, for example, current signals.

As shown, the transmitter 100 comprises a variable gain amplifier 12, a mixer 20, a power amplifier 30 and an antenna ANA. The mixer 20 mixes the baseband signal BS with local oscillation signal LOS generated by the local oscillator LO, up-converting the baseband signal BS to a radio frequency signal as the input signal $S_i$. The variable gain amplifier 12 amplifies the input signal $S_i$ and outputs an output signal $S_o$ based on the gain control signal $S_{CF}$. The power amplifier 30 amplifies the output signal $S_o$ from the variable gain amplifier 12 and transmits to a receiver (not shown) via the antenna ANA.

The variable gain controller 12 comprises a variable gain amplification circuit 10, an adder 15, and a gain gradient controller 14. Input terminal and output terminal of the variable gain amplification circuit 10 are coupled to an input signal $S_i$ and an output signal $S_o$ respectively. Two input terminals of the adder 15 are coupled to two gain control signals $S_C$ and $S_{CT}$ respectively. Output terminal of the adder 15 is coupled to the control terminal of the variable gain amplification circuit 10. The gain gradient controller 14 converts the programmable signals $S_n$ to a signal proportional to absolute temperature, serving as the gain control signal $S_{CT}$.

The gain control signal $S_{CT}$ can be generated based on the programmable signals $S_n$ and the following formula:

$$S_{CT} = S_1\left(\frac{T}{T_0} - 1\right) + S_2\left(\left(\frac{T}{T_0}\right)^2 - 1\right) + \ldots + S_N\left(\left(\frac{T}{T_0}\right)^N - 1\right) \quad (2)$$

$$= \sum_{1}^{N} S_n\left(\left(\frac{T}{T_0}\right)^N - 1\right)$$

Wherein T represents a present temperature, $T_0$ represents a predetermined temperature and $S_n$ represents the $n^{th}$ programmable signal, and the gain control signal $S_{CT}$ is zero when $T=T_0$.

Figure 4:
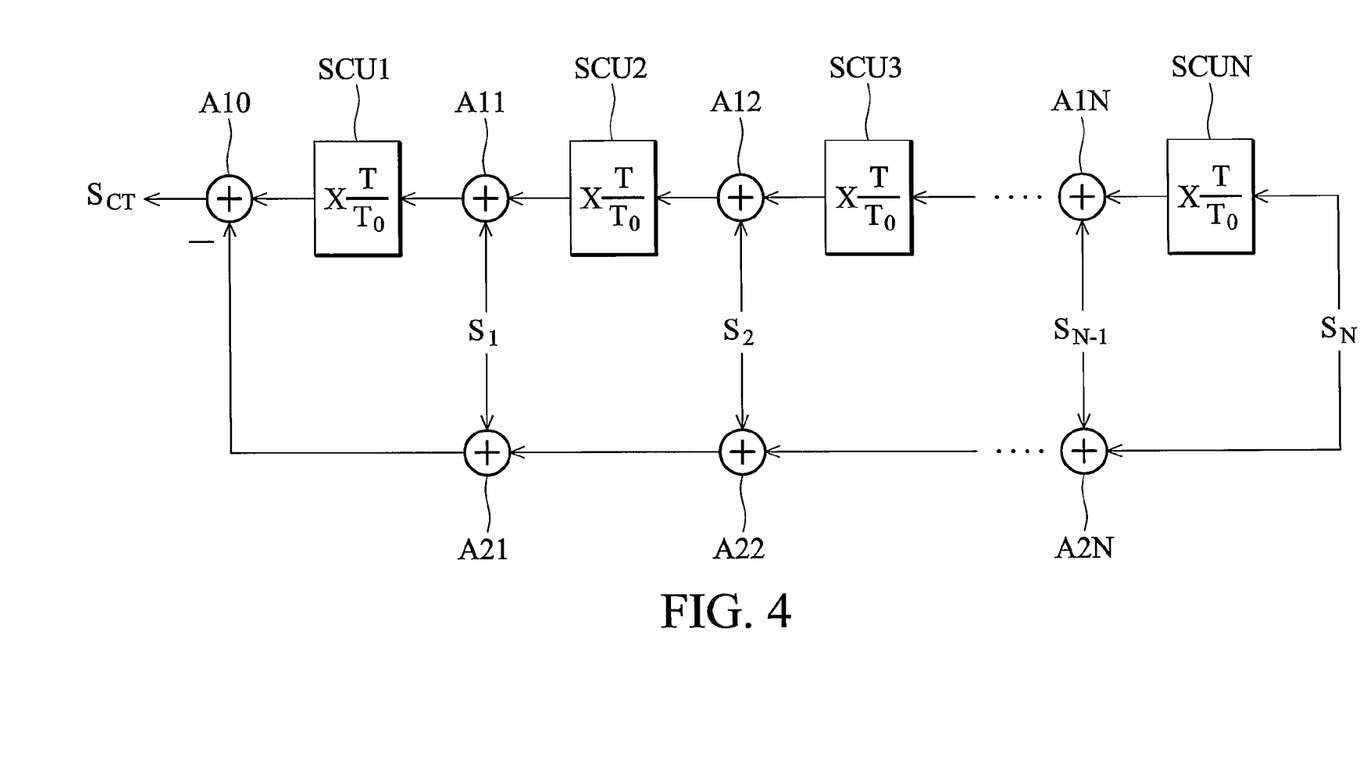
FIG. 4 shows an embodiment of a gain gradient controller.

FIG. 4 shows an embodiment of a gain gradient controller. As shown, the gain gradient controller 14 comprises signal converters SCU1~SCUN, and adders A10~A1N and A21~A2N, generating the control signal $S_{CT}$ based on formula (2).

In one example of first order, such as N=1, the programmable signal $S_1$ is input to a first input terminal of the adder A10 and the input terminal of the signal converter SCU1, and thus, the control signal $S_{CT}$ can be represented as $$S_{CT} = S_1\left(\frac{T}{T_0} - 1\right).$$

Alternately, in an example of second order, such as N=2, the programmable signal $S_1$ is input to first input terminals of the adders A11 and A21, the programmable signal $S_2$ is input to the signal converter SCU2 and a second input terminal of the adder A21, and thus, the control signal $S_{CT}$ can be represented as $$S_{CT} = S_1\left(\frac{T}{T_0} - 1\right) + S_2\left(\left(\frac{T}{T_0}\right)^2 - 1\right),$$

and so on.

Figure 5:
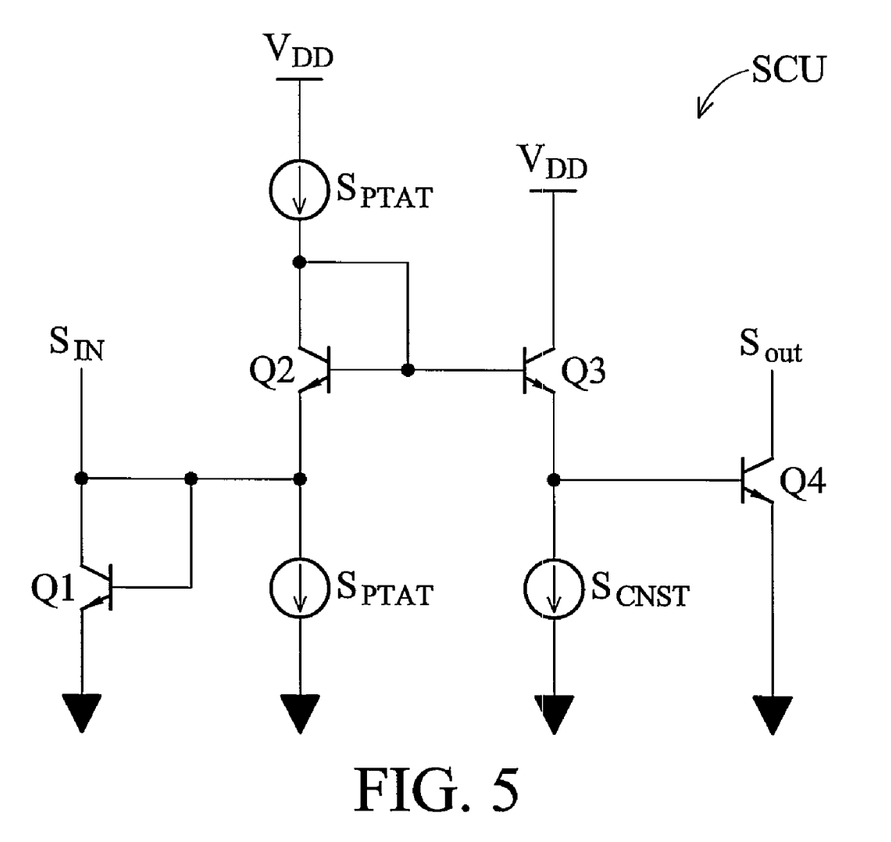
FIG. 5 shows an embodiment of a signal converter in the gain gradient controller.

FIG. 5 shows an embodiment of a signal converter in the gain gradient controller. As shown, the signal converter SCU (SCU1, SCU2, . . . , or SCUN) comprises four transistors Q1~Q4, a constant signal source $S_{CNST}$, and two proportional to absolute temperature (PTAT) signal sources $S_{PTAT}$. The signal converter SCU converts a constant signal to a proportional to absolute temperature (PTAT) signal based on the following formula:

$$S_{OUT} = \frac{S_{PTAT}}{S_{CNST}} S_{IN} = \frac{T}{T_0} S_{IN}$$

In the embodiment, as the programmable signals $S_1$~$S_n$, the control signals $S_C$ and $S_{CT}$ can be current signals, the signal source $S_{CNST}$ can be a constant current source, and the proportional to absolute temperature (PTAT) signal sources $S_{PTAT}$ can be PTAT current sources. Namely, the signal converter SCU converts a constant current signal to a PTAT current signal. Thus, the gain gradient controller 14 converts the programmable signals $S_1$~$S_n$ to the second gain control signal $S_{CT}$, proportional to absolute temperature.

Based on the formula (1), gain of the variable gain amplifier 12 can rewritten as:

$$G = \frac{So}{Si} = G_{max} + K_G(Sc - S_{offset} + S_{CT}) \quad (2)$$

According to the formula (2), the gain control signal $S_{CT}$ would be zero when $T=T_0$, and thus, the gain $G_{T0}$ of variable gain amplifier 12 at temperature $T_0$ can be regarded as:

$$G_{T0} = \frac{Si}{So} = G_{max} + K_G(Sc - S_{offset})$$

Further, gain gradient of the variable gain amplifier 12 can be obtained by differential to the formula (2), and thus, the gain gradient can be represented as:

$$dG_{mT} = \frac{\partial^m G}{\partial^m T} = \sum_{n=m}^{N} S_n \frac{n!}{(n-m)!} \frac{T^{n-m}}{T_0^n}$$

Wherein m=1, 2, 3, . . . N, and $dG_{mt}$ represents $m^{th}$ order gain gradient over temperature.

In an example of first order, such as N=1, the control signal $S_{CT}$ can be represented as $$S_{CT} = S_1\left(\frac{T}{T_0} - 1\right),$$

and $$\frac{\partial G}{\partial T} = \frac{S_1}{T_0},$$

and thus, the gain gradient over temperature can be defined by programmable signal $S_1$.

In an example of second order, such as N=2, the control signal $S_{CT}$ can be represented as $$S_{CT} = S_1\left(\frac{T}{T_0} - 1\right) + S_2\left(\left(\frac{T}{T_0}\right)^2 - 1\right), \frac{\partial G}{\partial T} = \frac{S_1}{T_0} + 2 \times \frac{T}{T_0} S_2$$

and $$\frac{\partial^2 G}{\partial^2 T} = 2 \times \frac{1}{T_0} S_2,$$

and thus, the gain gradient over temperature can be defined by programmable signals $S_1$ and $S_2$, and so on.

Figure 6A:
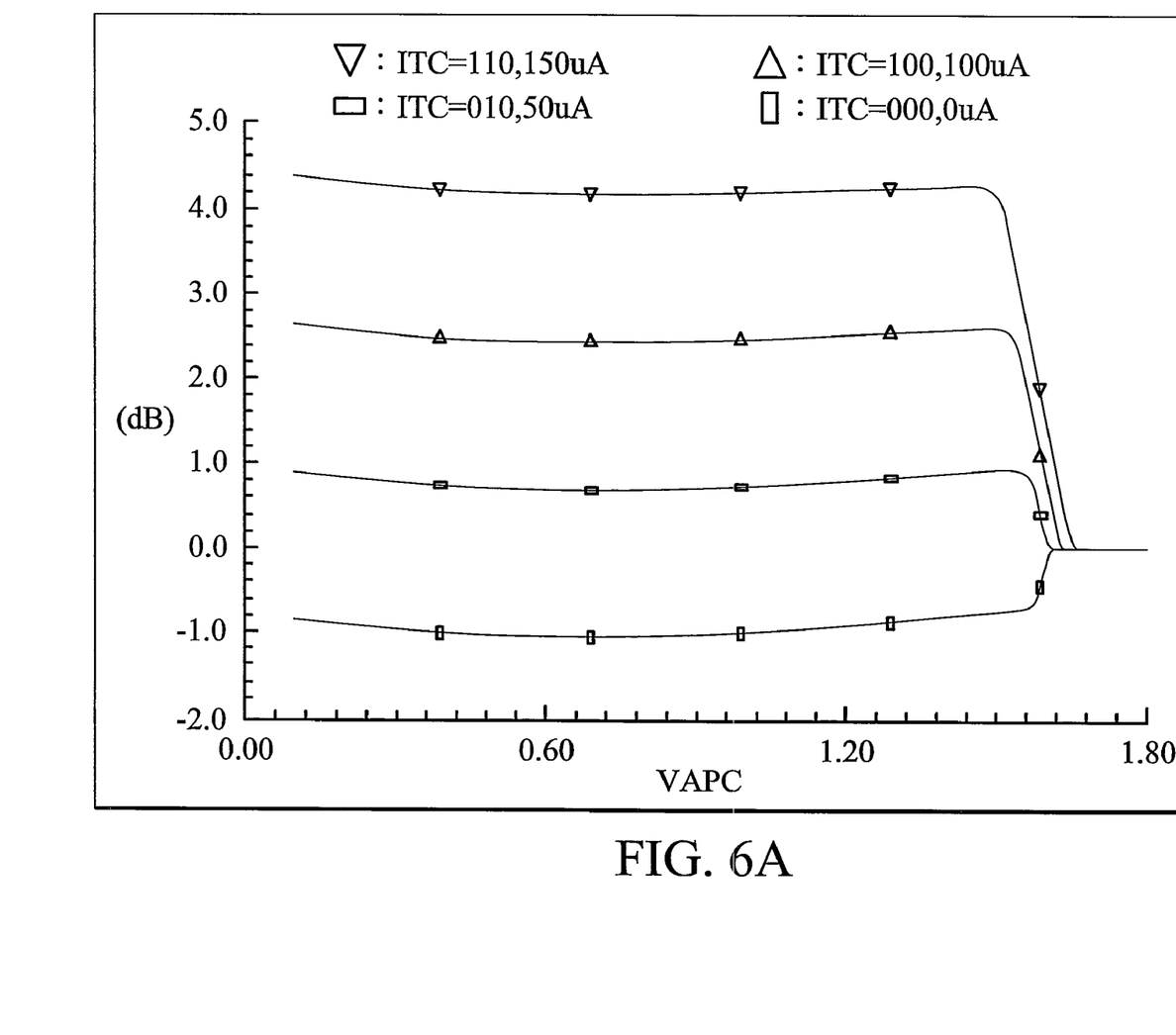
FIGS. 6A and 6B show simulated results of the variable gain amplifier.
Figure 6B:
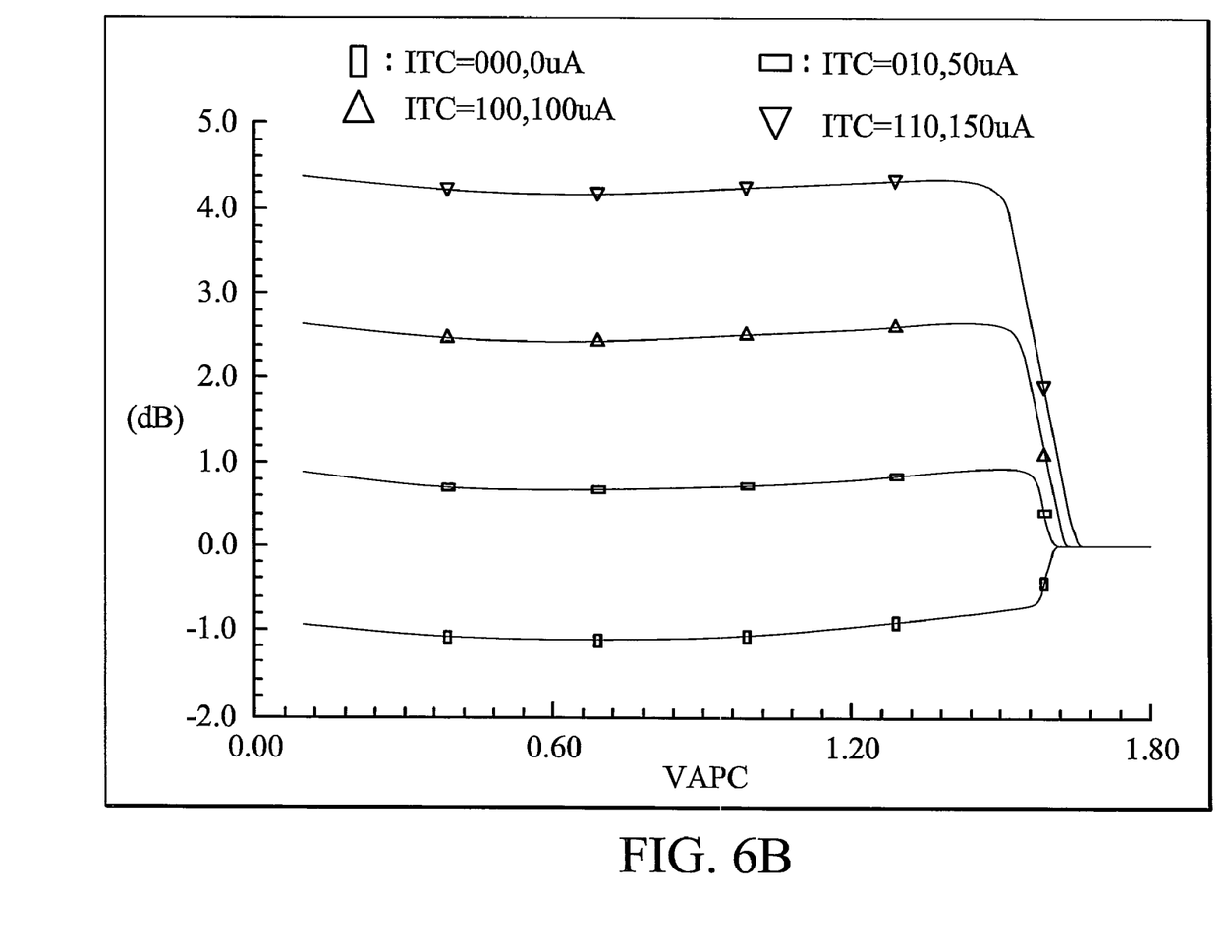

FIGS. 6A and 6B show simulated results of the variable gain amplifier 12 in which $$\frac{\partial G}{\partial T} = \frac{S_1}{T_0}.$$

Figure 7:
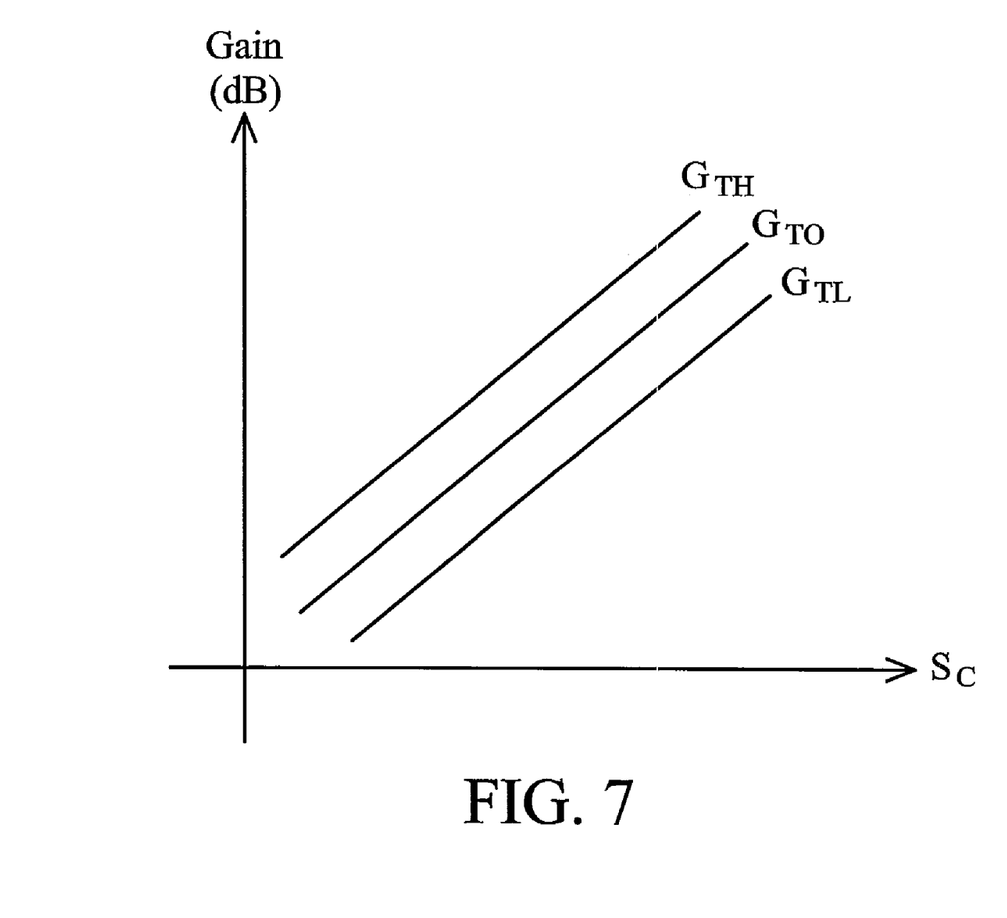
FIG. 7 shows the relationship between the control signal and gain of the variable gain amplifier of the invention.

As shown, the gain of the variable gain amplifier 12 increases 2 dB per temperature increase of 100° C. and the programmable signal $S_1$ (current signal) increases 50 µA. FIG. 7 shows the relationship between the control signal $S_C$ and gain (in dB scale) of the variable gain amplifier 12 under different temperatures, and gain gradient over temperature of the variable gain amplifier 12 is programmable. For example, line $G_{T0}$ represents the gain gradient of the variable gain amplifier 12 at the predetermined temperature $T_0$, line $G_{TL}$ represents the gain gradient of the variable gain amplifier 12 at a lower temperature, and line $G_{TH}$ represents the gain gradient of the variable gain amplifier 12 at a higher temperature. As shown, the variable gain amplifier 12 has different gain gradients under the same control signal $S_{CT}$. Thus, the invention can control gain gradient over temperature of the variable gain amplifier 12 by programming the programmable signals $S_1$~$S_n$.

The invention also provides a gain control method for a variable gain amplifier. In this method, the relationship between gain of the variable gain amplifier and temperature is controllable rather than temperature independent as shown in FIG. 2. For example, in this method, gain of a variable gain amplification circuit 10 shown in FIG. 3 is linearly controlled based on a first gain control signal $S_C$, and gain gradient of the variable gain amplification circuit 10 over temperature is controlled based on a second gain control signal $S_{CT}$.

Further, the second gain control signal $S_{CT}$ can, for example, be generated by a programmable means, such as gain gradient controller 14 shown in FIG. 3, based on at least one programmable signal $S_1$~$S_n$, and is determined based on a formula of $$S_{CT} = \sum_{n=1}^{N} S_n \left[ \left( \frac{T}{T_0} \right)^n - 1 \right],$$

in which $T_0$ represents a predetermined temperature, T represents a present temperature, and $S_n$ represents the $n^{th}$ programmable signal.

Because the gain of the variable gain amplifier 12 is a function of temperature rather than temperature independent due to the gain control signal $S_{CT}$ defined by programmable signals $S_1$~$S_n$, the invention controls relationship between gain of the variable gain amplifier and temperature, thereby compensating the temperature coefficient of transmitter output power.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A variable gain amplifier, comprising:
   a variable gain amplification circuit for amplifying an input signal to generate an output signal according to a first gain control signal which is a function of temperature, such that the relationship between gain of the variable gain amplification circuit and temperature is programmable, wherein the first gain control signal is obtained by a second gain control signal and a third gain control signal; and
   a gain gradient controller for generating the third gain control signal according to at least one programmable signal to determine gain gradient of the variable gain amplification circuit over temperature, wherein the third gain control signal is independent of the input signal.

2. The variable gain amplifier as claimed in claim 1, wherein the gain of the variable gain amplification circuit is controlled linearly based on the second gain control signal.

3. The variable gain amplifier as claimed in claim 2, wherein the third gain control signal ($S_{CT}$) is determined based on a formula of $$S_{CT} = \sum_{n=1}^{N} S_n \left[ \left( \frac{T}{T_0} \right)^n - 1 \right],$$

in which $T_0$ represents a predetermined temperature, T represents a present temperature, and $S_n$ represents an $n^{th}$ programmable signal.

4. The variable gain amplifier as claimed in claim 2, further comprising a combination unit adding the third gain control signal and the second gain control signal to obtain the first gain control signal.

5. A transceiver, comprising:
   a variable gain amplifier as claimed in claim 1, the variable gain amplifier for amplifying the input signal and outputting the output signal based on the first gain control signal; and
   a power amplifier for amplifying the output signal from the variable gain amplifier and transmitting to a receiver via an antenna.

6. A variable gain amplifier, comprising:
   an input terminal for receiving an input signal;
   an output terminal for outputting an output signal; and
   a programmable means for controlling the relationship between gain of the variable gain amplifier and temperature,
   wherein the programmable means controls the gain of the variable gain amplifier linearly based on a first gain control signal and controls gain gradient of the variable gain amplifier based on a second gain control signal which is independent of the input signal.

7. The variable gain amplifier as claimed in claim 6, wherein the programming means comprises:
   a gain gradient controller generating the second gain control signal according to at least one programmable signal; and
   a combination unit adding the second gain control signal and the first gain control signal to obtain a final gain control signal.

8. The variable gain amplifier as claimed in claim 7, wherein the second gain control signal ($S_{CT}$) is determined based on a formula of $$S_{CT} = \sum_{n=1}^{N} S_n \left[ \left( \frac{T}{T_0} \right)^n - 1 \right],$$

in which $T_0$ represents a predetermined temperature, T represents a present temperature, and $S_n$ represents an $n^{th}$ programmable signal.

9. The variable gain amplifier as claimed in claim 6, further comprising means for amplifying the input signal and outputting the output signal.

10. A transceiver, comprising:
- a variable gain amplifier as claimed in claim 6, for amplifying the input signal and outputting the output signal based on the gain control signal; and
- a power amplifier for amplifying the output signal from the variable gain amplifier and transmitting to a receiver via an antenna.

11. A gain control method for a variable gain amplifier, comprising:
- controlling gain of a variable gain amplification circuit linearly based on a first gain control signal; and
- controlling gain gradient of the variable gain amplification circuit over temperature based on a second gain control signal, which is a function of temperature and is different from the first gain control signal, wherein the second gain control signal is independent of an input signal input to the variable gain amplification circuit.

12. The gain control method as claimed in claim 11, wherein the second gain control signal is generated by a programmable means based on at least one programmable signal.

13. The gain control method as claimed in claim 11, wherein the second gain control signal ($S_{CT}$) is determined based on a formula of $$S_{CT} = \sum_{n=1}^{N} S_n \left[ \left( \frac{T}{T_0} \right)^n - 1 \right],$$

in which $T_0$ represents a predetermined temperature, T represents a present temperature, and $S_n$ represents the $n^{th}$ programmable signal.

14. A variable gain amplifier, comprising:
- a variable gain amplification circuit for amplifying an input signal to generate an output signal according to a first gain control signal which is a function of temperature, such that the relationship between gain of the variable gain amplification circuit and temperature is programmable, wherein the first gain control signal is obtained by a second gain control signal and a third gain control signal; and
- a gain gradient controller for generating the third gain control signal according to at least one programmable signal to determine gain gradient of the variable gain amplification circuit over temperature,
- wherein the third gain control signal ($S_{CT}$) is determined based on a formula of $$S_{CT} = \sum_{n=1}^{N} S_n \left[ \left( \frac{T}{T_0} \right)^n - 1 \right],$$

in which $T_0$ represents a predetermined temperature, T represents a present temperature, and $S_n$ represents the $n^{th}$ programmable signal.

* * * * *